US010608074B2

(12) United States Patent
Kim et al.

(10) Patent No.: US 10,608,074 B2
(45) Date of Patent: Mar. 31, 2020

(54) OLED PANEL FOR LIGHTING DEVICE AND METHOD OF MANUFACTURING THE SAME

(71) Applicant: LG DISPLAY CO., LTD., Seoul (KR)

(72) Inventors: Taeok Kim, Seoul (KR); Taejoon Song, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/184,671

(22) Filed: Nov. 8, 2018

(65) Prior Publication Data
US 2019/0165086 A1 May 30, 2019

(30) Foreign Application Priority Data
Nov. 29, 2017 (KR) .......................... 10-2017-0162293

(51) Int. Cl.
*H01L 27/32* (2006.01)
*H01L 51/52* (2006.01)
*H01L 51/56* (2006.01)

(52) U.S. Cl.
CPC ...... *H01L 27/3288* (2013.01); *H01L 51/5206* (2013.01); *H01L 51/5221* (2013.01);
(Continued)

(58) Field of Classification Search
CPC ............ H01L 27/3288; H01L 51/5206; H01L 51/5221; H01L 51/5228; H01L 51/5253; H01L 51/56
See application file for complete search history.

(56) References Cited

U.S. PATENT DOCUMENTS

2014/0306210 A1* 10/2014 Lee ................... H01L 51/5203
257/40
2018/0151643 A1* 5/2018 Lee ................... H01L 51/5234
(Continued)

FOREIGN PATENT DOCUMENTS

DE   10 2010 041 260 A1   7/2011
DE   10 2015 207 897 A1   11/2015
(Continued)

*Primary Examiner* — Matthew L Reames
(74) *Attorney, Agent, or Firm* — Seed IP Law Group LLP

(57) ABSTRACT

An OLED panel for a lighting device is provided. The OLED panel for a lighting device may include a substrate divided into a light emitting area and a pad area formed outside of the light emitting area; an auxiliary wiring pattern disposed on the substrate, the auxiliary wiring pattern having a taper-shaped cross-section whose width is gradually narrower toward an upper portion thereof; a first electrode disposed on the substrate on which the auxiliary wiring pattern is disposed; a passivation layer disposed on the first electrode within an area where the auxiliary wiring pattern disposed; an OLED light emitting structure disposed on the first electrode on which the passivation layer is disposed; a second electrode disposed on the OLED light emitting structure; and an encapsulating layer disposed on the second electrode, and the passivation layer may have a cross-section corresponding to a cross-section of the auxiliary wiring pattern in the light emitting area. The OLED panel for a lighting device may have a wide light emitting area by reducing a passivation area on the auxiliary wiring pattern.

22 Claims, 15 Drawing Sheets

(52) U.S. Cl.
CPC ...... *H01L 51/5228* (2013.01); *H01L 51/5253* (2013.01); *H01L 51/56* (2013.01); *H01L 2251/5361* (2013.01)

(56) References Cited

U.S. PATENT DOCUMENTS

| | | | |
|---|---|---|---|
| 2018/0159068 A1* | 6/2018 | Lee | H01L 51/5203 |
| 2018/0159071 A1* | 6/2018 | Song | H01L 27/3288 |
| 2019/0019981 A1* | 1/2019 | Kim | H01L 51/5237 |
| 2019/0165303 A1* | 5/2019 | Kim | H01L 51/5212 |
| 2019/0165306 A1* | 5/2019 | Lee | H01L 51/5228 |
| 2019/0172892 A1* | 6/2019 | Lee | H01L 27/3276 |

FOREIGN PATENT DOCUMENTS

| | | |
|---|---|---|
| EP | 3 331 039 A1 | 6/2018 |
| EP | 3 346 499 A1 | 7/2018 |
| JP | 2003-36971 A | 2/2003 |
| JP | 2005-183209 A | 7/2005 |
| JP | 2011-35388 A | 2/2011 |
| JP | 2012-49112 A | 3/2012 |
| JP | 2015-220089 A | 12/2015 |
| WO | 2014/122938 A1 | 8/2014 |
| WO | 2015/036287 A2 | 3/2015 |

\* cited by examiner

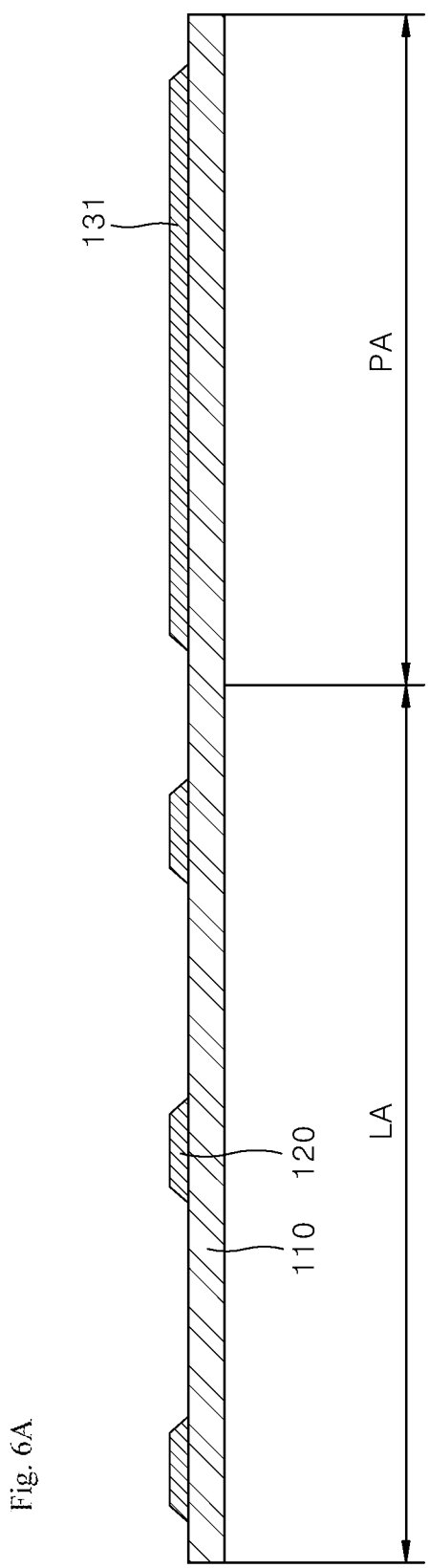

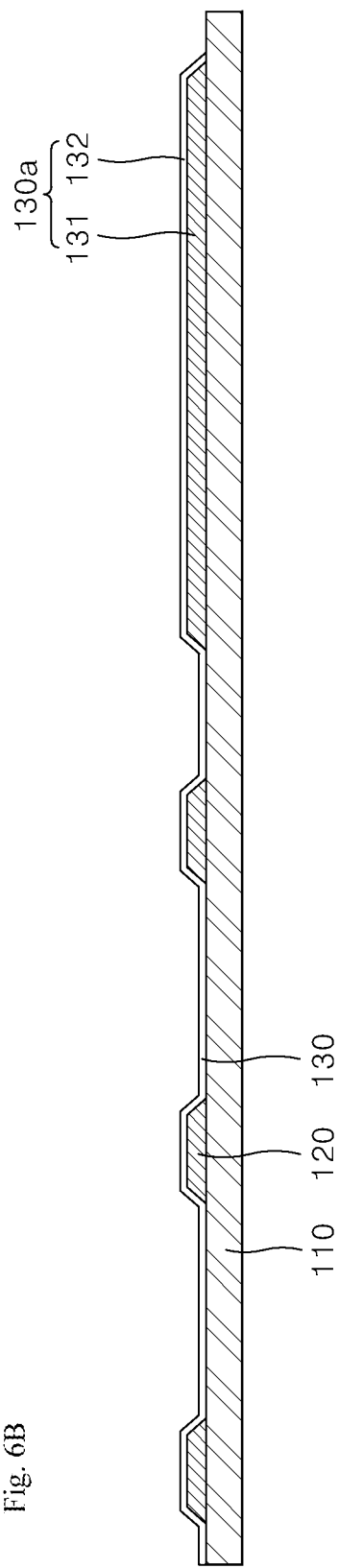

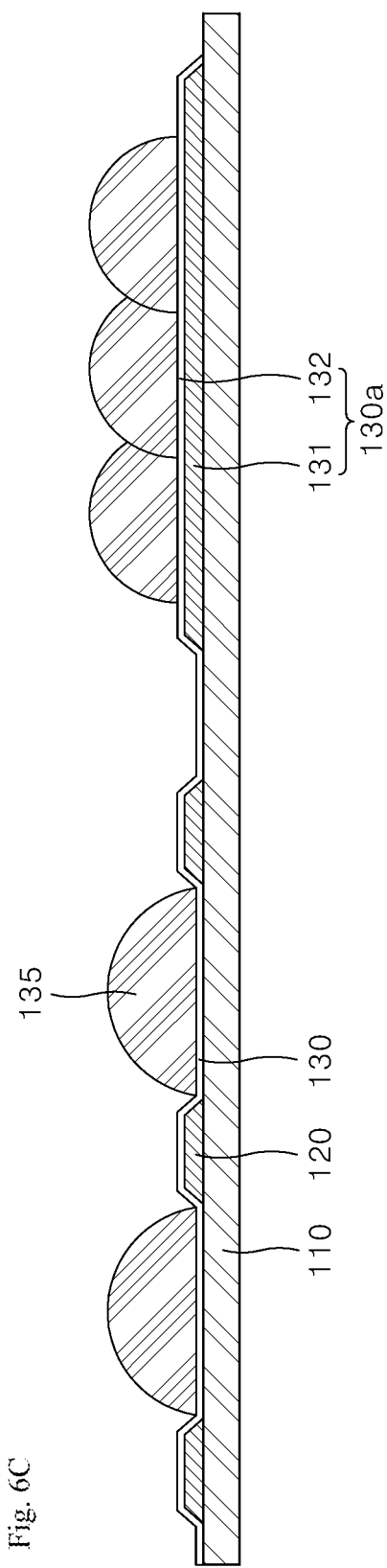

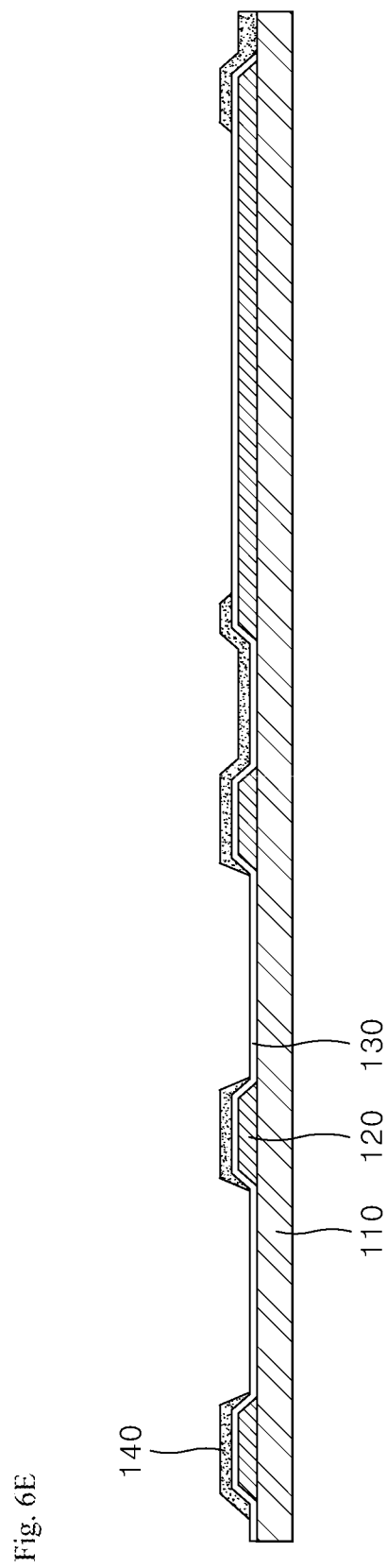

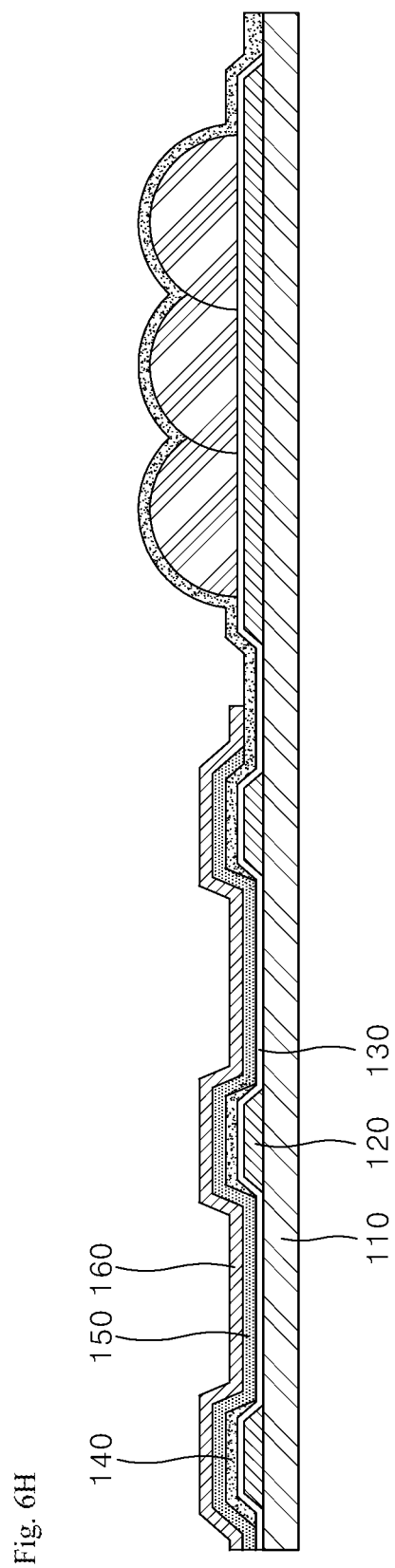

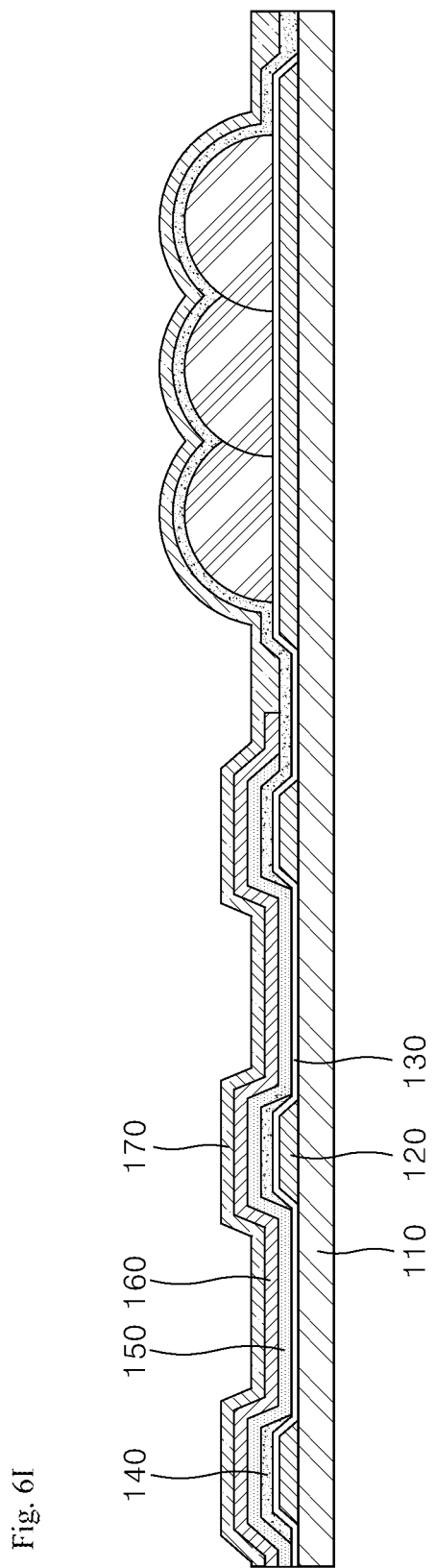

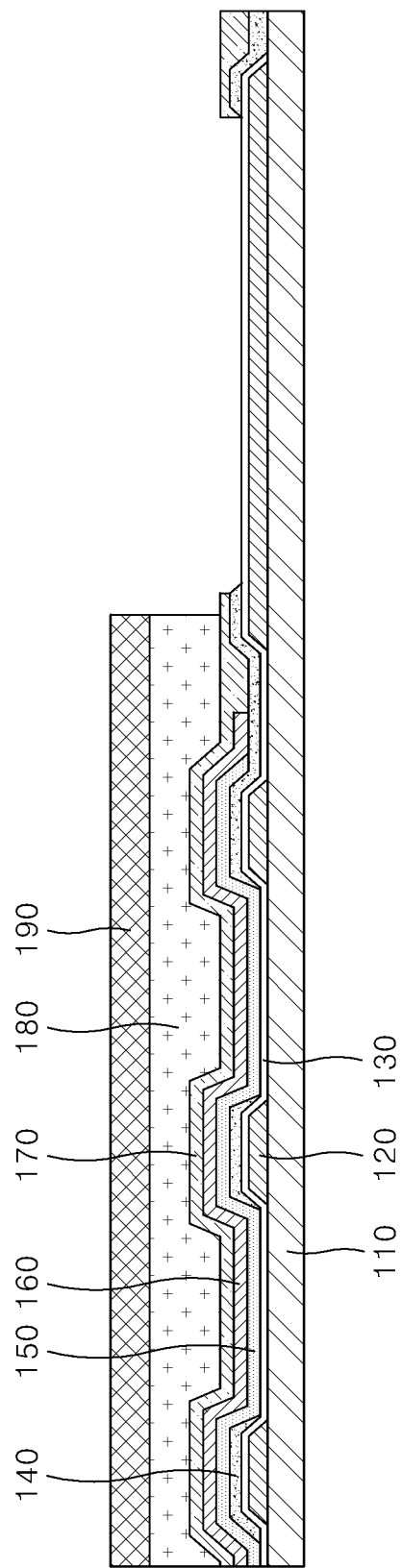

OLED PANEL FOR LIGHTING DEVICE AND METHOD OF MANUFACTURING THE SAME

CROSS-REFERENCE TO RELATED APPLICATION

This application claims priority under 35 U.S.C. § 119 to Korean Application No. 10-2017-0162293, filed on Nov. 29, 2017, whose entire disclosure is herein incorporated by reference.

BACKGROUND

Technical Field

The present disclosure relates to an organic light emitting diode (OLED) panel for a lighting device, more particularly, an OLED panel for a lighting device capable of having a large light emitting area.

Further, the present disclosure relates to a method of manufacturing an OLED panel for a lighting device.

Description of the Related Art

Currently, a fluorescent lamp or an incandescent lamp is mainly used as a lighting device. In the case of the incandescent lamp, a color rendering index is high, but energy efficiency is very low. Conversely, in the case of the fluorescent lamp, the energy efficiency is high, but the color rendering index is low. Further, the fluorescent lamp contains mercury, which causes environmental problems.

Recently, a light emitting diode (LED) based lighting device has been proposed. The LED, which has a laminated structure of a nitride semiconductor, such as GaN, has the highest light emission efficiency at a blue wavelength band, and decreasing light emission efficiency toward a red wavelength band and a green wavelength band which has the highest luminosity. Thus, when the lighting device emits white light output by a combination of a red LED, a green LED, and a blue LED, the light emission efficiency is lowered. Also, when using the red, green, and blue LEDs, each emission peak has a narrow width, so that a color rendering property deteriorates.

In order to solve these problems, a lighting device to output white light by combining the blue LED and a yellow phosphor instead of combining the red, green and blue LEDs has been proposed, because it is more efficient to use the blue LED having a higher light emission efficiency than the green LED, and for the other colors to use a fluorescent material that receives blue light to emit yellow light.

However, even though the lighting device outputs white light by combining the blue LED and a phosphor having yellow color, the fluorescent material itself emitting yellow light has poor light emission efficiency, and thus there is a limitation in improving the light emission efficiency of the lighting device.

In particular, a nitride semiconductor LED based lighting device has a limitation that a heat dissipating means should be disposed on a rear surface of the light device due to a large amount of heat generated by the LED, and that a high-priced sapphire should be used for growth of a high quality nitride semiconductor.

Further, manufacturing the LED based lighting device includes many processes, such as an epi process for growing a nitride semiconductor, a chip process for manufacturing an individual LED chip, and a mounting process for mounting the individual LED chips on a circuit board.

BRIEF SUMMARY

Embodiments disclosed herein provide an OLED (organic light emitting diode) panel for a lighting device.

Embodiments disclosed herein also provide a method of manufacturing the OLED panel for a lighting device.

According to an embodiment of the present disclosure, an OLED panel for a lighting device may include a substrate; an auxiliary wiring pattern; a first electrode; a passivation layer; an OLED light emitting structure; a second electrode; and an encapsulating layer.

The substrate may be divided into a light emitting area, and a pad area formed outside of the light emitting area. The auxiliary wiring pattern includes a plurality of auxiliary wirings electrically connected to each other. The auxiliary wiring pattern may be disposed on the substrate and may have a taper-shaped cross-section whose width is gradually narrower toward an upper portion thereof. The first electrode may be disposed on the substrate on which the auxiliary wiring pattern is disposed. The passivation layer may be disposed on the first electrode within an area where the auxiliary wiring pattern is disposed. The OLED light emitting structure may be disposed on the first electrode on which the passivation layer is disposed. The second electrode may be disposed on the OLED light emitting structure. The encapsulating layer may be disposed on the second electrode.

In one embodiment, the passivation layer has a cross-section corresponding to the cross-section of the auxiliary wiring pattern. For example, the passivation layer may include portions on the auxiliary wiring pattern that have a taper-shaped cross-section whose width is gradually narrower toward an upper portion thereof. Because the passivation layer includes portions that have a cross-section corresponding to the cross-section of the auxiliary wiring pattern, it is possible to reduce the total surface area of the passivation layer to obtain a large light emitting area.

More specifically, the passivation layer may include an upper planar portion and an inclined portion extending downward from the upper planar portion. A general passivation layer includes an upper planar portion, an inclined portion, and a lower planar portion extending from the inclined portion. In the present disclosure, a light emitting area may be increased by having a structure in which the lower planar portion is removed.

In addition, the passivation layer may be further disposed at an edge of the light emitting area and an edge of the pad area which are relatively vulnerable to moisture permeation, thereby enhancing the effect of preventing the occurrence of a short circuit between the first electrode and the second electrode due to the moisture permeation.

According to another embodiment of the present disclosure, a method of manufacturing a OLED panel for a lighting device may include: disposing an auxiliary wiring pattern including a plurality of auxiliary wirings electrically connected to each other on a substrate divided into a light emitting area and a pad area; disposing a first electrode on the substrate on which auxiliary wiring pattern is disposed; disposing a polymer on the first electrode, and placing the polymer between the adjacent auxiliary wirings of the auxiliary wiring pattern in the light emitting area; depositing a passivation material on the first electrode using the polymer as a mask, and then removing the polymer to form a passivation layer on respective upper portions of the auxiliary wirings of the auxiliary wiring pattern in the light emitting area; disposing an OLED light emitting structure on the first electrode on which the passivation layer is disposed; disposing a second electrode on the OLED light emitting structure; and, forming an encapsulating layer on the second electrode.

In one embodiment, the disposition of the polymer is performed by printing a liquid polymer by means of an ink jet method and then curing the liquid polymer.

Also, various deposition methods such as, atomic layer deposition (ALD) and chemical vapor deposition (CVD) may be applied for deposition of the passivation material. Preferably, the passivation material may be deposited by an atmospheric pressure ALD method. And, the polymer may include a photolyzable catalyst. The removal of the polymer may be performed by activating the catalyst by light irradiation to alleviate the adhesion of the polymer.

According to one embodiment of the present disclosure, the OLED panel for a light device may be easily manufactured to have a large-area, and thereby it is possible to emit light through a light emitting surface; may not require a high-priced sapphire for forming a nitride semiconductor LED; and may have a better heat generating performance than the nitride semiconductor LED.

According to one embodiment of the present disclosure, the OLED panel for a light device may form a passivation layer using a polymer mask which may be self-aligned by a stepped portion, thereby reducing the area of the passivation layer. As a result, it is possible to secure a wide light emitting area.

In addition, when the passivation layer is patterned by a dry etching method, the loss of the first electrode occurs. Conversely, when the passivation layer is patterned by using the poly mask capable of self-alignment and removing the same by photolysis according to an embodiment of the present disclosure, the loss of the first electrode does not occur. As a result, it is possible to improve first electrode thickness uniformity.

According to one embodiment of the present disclosure, the polymer mask may be applied to the pad area, thereby reducing the number of masks required for a process.

BRIEF DESCRIPTION OF THE SEVERAL VIEWS OF THE DRAWINGS

FIGS. 6A to 6K show a method of manufacturing an OLED panel for a lighting device according to an embodiment.

DETAILED DESCRIPTION

Hereinafter, an organic light emitting diode (OLED) panel for a light device and a method for the same according to embodiments of the present disclosure will be described with reference to the accompanying drawings.

Terms such as first, second, etc., may be used herein to describe components. Such terms are not used to define a corresponding component, but are used merely to distinguish the corresponding component from another component.

In describing a positional relationship using phrases such as "component A on component B" and "component A above component B," another component C may be arranged between the components A and B unless the term "immediately" or "directly" is explicitly used.

Figure 1:
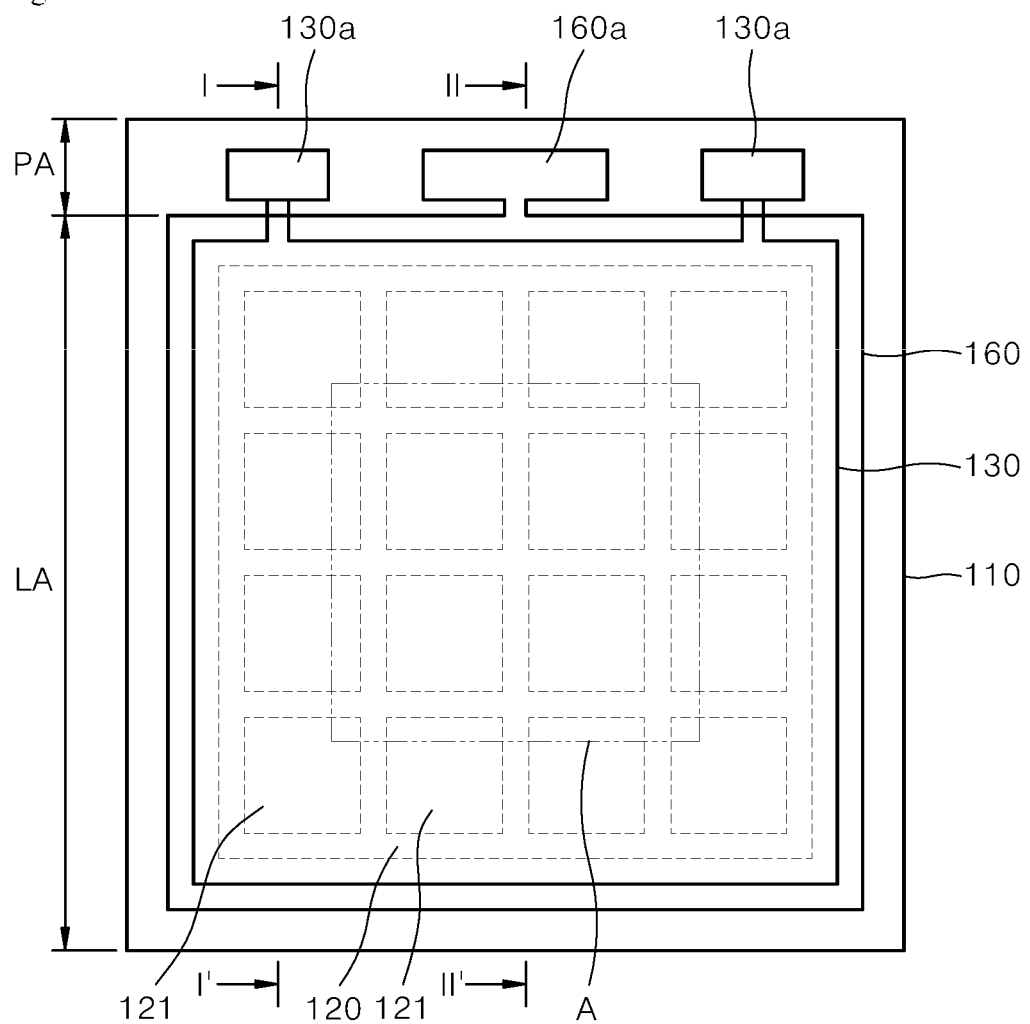
FIG. 1 is a schematic plan view of an OLED panel for a lighting device according to an embodiment.

FIG. 1 is a schematic plan view of an OLED panel for a lighting device according to an embodiment. Also, FIG. 2 is a cross-sectional view taken along I-I' line of FIG. 1 according to an embodiment, and FIG. 3 is a cross-sectional view taken along II-II' line of FIG. 1 according to an embodiment.

Figure 2:
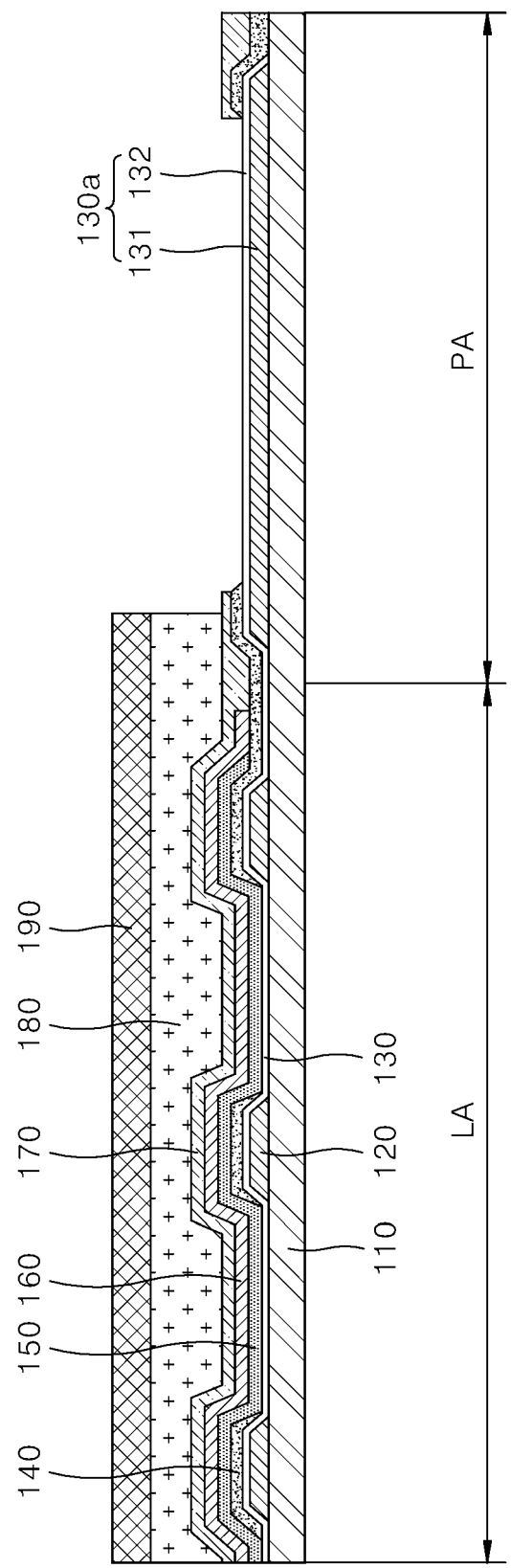
FIG. 2 is a cross-sectional view taken along I-I' line of FIG. 1 according to an embodiment.
Figure 3:
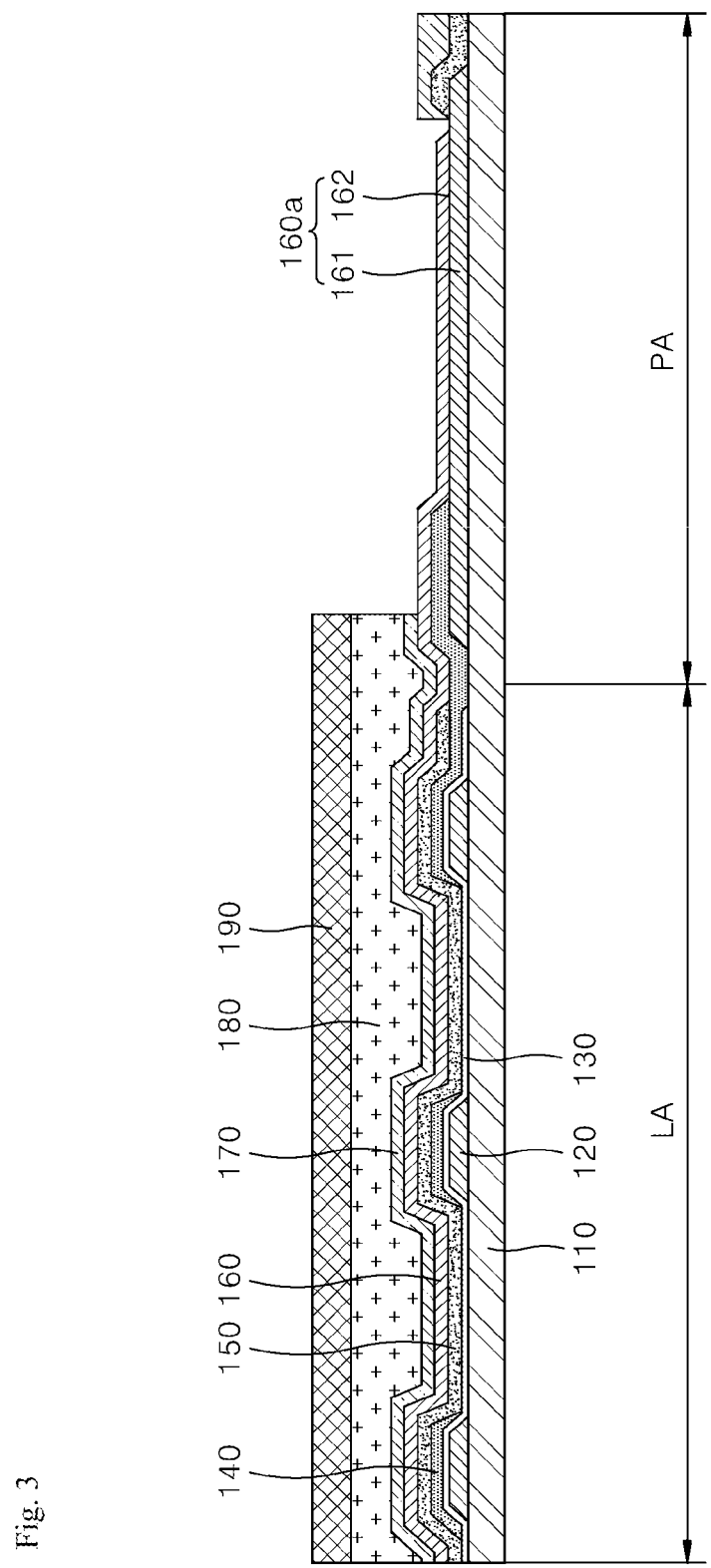
FIG. 3 is a cross-sectional view taken along II-II' line of FIG. 1 according to an embodiment.

Referring to FIGS. 1 to 3, the OLED panel for a lighting device of the present disclosure may include a substrate 110, an auxiliary wiring pattern 120, a first electrode 130, a passivation layer 140, an OLED light emitting structure 150, a second electrode 160, and an encapsulating layer 170.

The substrate 110 may be divided into a light emitting area (LA) and a pad area (PA) formed outside of the LA.

The substrate 110 may be a glass substrate or a polymer substrate. When the polymer substrate is used as the substrate 110, the OLED panel for a lighting device may be manufactured by a roll-to-roll process since the polymer substrate is flexible.

The auxiliary wiring pattern 120 may be disposed on the substrate 110, and may have a taper-shaped cross-section whose width is gradually narrower toward an upper portion thereof.

The auxiliary wiring pattern 120 may include a plurality of auxiliary wirings electrically connected to each other. The role of the auxiliary wiring pattern 120 is as follows. The first electrode 130 may be formed of a transparent conductive oxide (TCO) material, such as indium tin oxide (ITO), fluorine-doped tin oxide (FTO), etc. The TCO material may penetrate light emitted from the OLED light emitting structure 150, but may have higher electric resistance than a metal material. Therefore, when manufacturing an OLED panel for a large-area lighting device, an applied voltage may be unevenly distributed over the entire first electrode due to the high resistance of the TCO material. Such uneven voltage distribution lowers the luminance uniformity of the large-area lighting device.

Hence, the auxiliary wiring pattern 120 may be formed of a material having lower resistance than the TCO material, such as a material including metal, and thereby, the auxiliary wiring pattern 120 may serve to evenly distribute the voltage applied to the first electrode 130 in contact with the auxiliary wiring pattern 120 over the entire first electrode 130.

In the meantime, the auxiliary wiring pattern 120 may be formed in a net shape as shown in FIG. 1, but is not limited thereto. For example, as shown in FIG. 1, the auxiliary wiring pattern 120 may be a conductive layer with a plurality of openings 121. In one embodiment, as shown in FIG. 1, the openings 121 may be arranged in an array including a plurality of rows and columns. Further, the auxiliary wiring pattern 120 may be almost symmetrical vertically, but is not limited thereto.

The first electrode 130 may be disposed on the substrate on which the auxiliary wiring pattern 120 is disposed. As described above, the first electrode 130 may be formed of the TCO material such as, for example, ITO, and may be formed through a sputtering process or a coating process.

The passivation layer 140 may be disposed on the first electrode 130 within an area where the auxiliary wiring pattern 120 is disposed.

When a short circuit between the first electrode and the second electrode occurs in the OLED lighting device, the luminance of the entire panel as well as the portion where the short circuit occurs may be lowered due to a current drop. In order to prevent a short circuit and the luminance from being lowered, the passivation layer 140 may be formed on respective upper portions of the auxiliary wirings of the auxiliary wiring pattern 120.

The passivation layer 140 may be formed of an organic material, such as a polyimide based material, or an inorganic material, such as alumina ($Al_2O_3$), silicon nitride (SiNx), etc.

Figure 4:
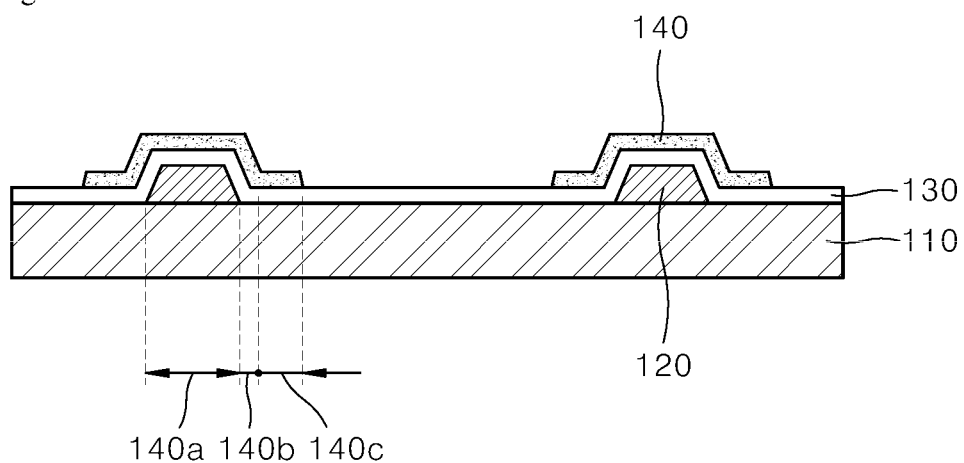
FIG. 4 is a cross-sectional view showing an example of the disposition of a passivation layer in an area A of FIG. 1 according to an embodiment.
Figure 5:
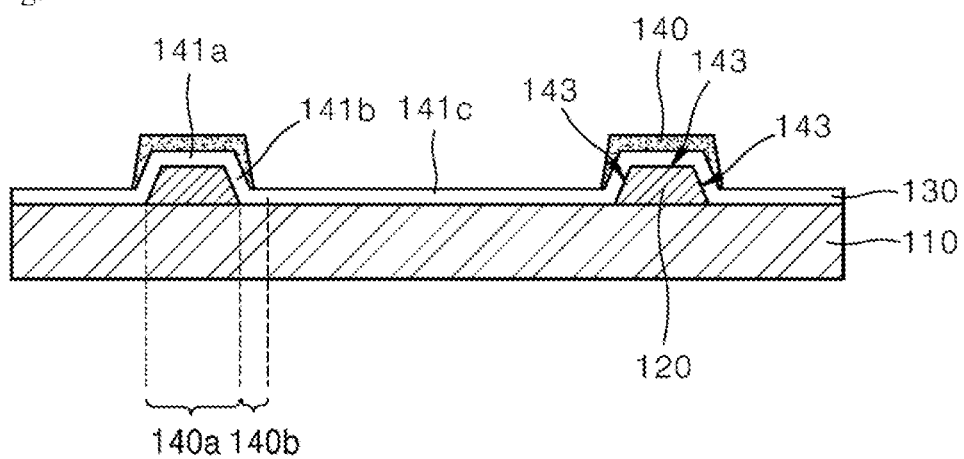
FIG. 5 is a cross-sectional view showing another example of the disposition of a passivation layer in an area A of FIG. 1 according to an embodiment.

FIG. 4 is a cross-sectional view of an example of a passivation layer disposed in an area A (i.e., a light emitting area) of FIG. 1. FIG. 5 is a cross-sectional view of another example of a passivation layer disposed in an area A (i.e., a light emitting area) of FIG. 1.

The passivation layer 140 may have a cross-sectional shape as shown in FIG. 4 as a result of patterning the passivation material through, for example, deposition and dry etching of the passivation material. When the passivation material is patterned through dry etching, the passivation layer may include a lower planar portion 140c in addition to an upper planar portion 140a and an inclined portion 140b due to a process margin. The presence of the lower plane portion 140c may lead to a reduction in the light emitting area. Also, patterning through dry etching may result in a partial loss of the first electrode 130, which may be a factor to lower the thickness uniformity of the first electrode 130.

However, the passivation layer 140 having a cross-sectional shape as shown in FIG. 5 may have a cross-sectional shape corresponding to that of the auxiliary wiring pattern 120. For example, as shown in FIG. 5, the cross-section of the passivation layer 140 has a shape that corresponds to a shape of the uppermost planar and inclined surfaces 143 of the auxiliary wiring pattern 120. That is, the passivation layer 140 conforms to the uppermost planar and inclined surfaces 143 of the auxiliary wiring pattern 120. More specifically, the passivation layer 140 may include an upper planar portion 140a and an inclined portion 140b extending downward from the upper planar portion 140c, and may not include a lower planar portion 140c. Stated differently, as shown in FIG. 5, the passivation layer 140 may be formed on and overlap upper planar portions 141a and inclined portions 141b of the first electrode 130. Lower planar portions 141c of the first electrode 130 may be left substantially uncovered by the passivation layer 140.

The passivation layer 140, which has a cross-sectional shape corresponding to that of the auxiliary wiring pattern 120, that is, includes the upper planar portion 140a and the inclined portion 140b, may be achieved, for example, by application of a photolyzable polymer mask described later. In this case, the passivation layer 140 may not include the lower planar portion 140c unlike FIG. 4, and thereby it is possible to increase the light emitting area. In addition, the polymer mask of the present disclosure may be photolyzed, so that there is no problem of lowering the thickness uniformity of the first electrode 130.

The passivation layer 140 may be further disposed at the edges of the LA and PA which are relatively vulnerable to moisture permeation, thereby enhancing the effect of preventing the occurrence of a short circuit between the first electrode and the second electrode due to the moisture permeation.

The OLED light emitting structure 150 may be disposed on the first electrode 130 on which the passivation layer 140 is also disposed. The OLED light emitting structure 150 may include an emission layer (EML); a hole injection layer (HIL) and/or a hole transport layer (HTL) to provide a hole to the emission layer; and an electron transport layer (ETL) and/or an electron injection layer (EIL) to provide an electron to the emission layer.

The second electrode 160 may be disposed on the OLED light emitting structure 150. The second electrode 160 may be formed of a TCO material, such as ITO, or a metal material, such as Al, Ag, etc. For example, in the case of a bottom emission type, the second electrode 160 may be formed of the metal material, and in the case of a double-sided emission type, the second electrode 160 may be formed of the TCO material.

In addition, the entire OLED light emitting structure 150 and the entire second electrode 160 may be formed within the LA, and each of them may have a cross-section corresponding to that of the first electrode 130.

The encapsulating layer 170 may be disposed on the second electrode 160, and may prevent water or air from being permeated from the outside. Such an encapsulating layer 170 may be formed of an organic material, such as an acrylate based compound and an epoxy based compound; an inorganic material, such as ceramics and metal; or an organic-inorganic composite material. Further, the encapsulating layer 170 may have a single-layer structure or a multi-layer structure.

FIGS. 2 and 3 show an example in which the encapsulating layer 170 is formed on the upper portion of the second electrode 160. However, in order to enhance the effect of preventing moisture, etc., from permeating in to the OLED panel, the encapsulating layer 170 may also be formed at sides of the respective components 110 to 160 formed in the LA.

A protective film 190 may be further disposed on the encapsulating layer 170 through an adhesive layer 180. Namely, the adhesive layer 180 may be formed on the encapsulating layer 170, and the protective film 190 may be formed on the adhesive layer 180. The protective film 190 also may prevent moisture or air from permeating in to the OLED panel from the outside. The protective film 190 may be a PET substrate, a metal foil, etc.

In the following, the PA will be described. In the PA, a first electrode pad 130a and a second electrode pad 160a may be disposed. The first electrode pad 130a and the second electrode pad 160a may be connected to an external power source. The first electrode pad 130a may be electrically coupled to the first electrode 130. The second electrode pad 160a may be electrically coupled to the second electrode 160. As best shown in FIG. 1, the second electrode pad 160a may be disposed at a central portion of the PA, and the first electrode pads 130a may be respectively disposed at opposite sides of the second electrode pad 160a. However, when the first electrode 130a and the second electrode pad 160a are respectively electrically coupled to the first electrode 130 and the second electrode 160, the disposition, the size, the number, etc., of the electrode pads may be changed.

Referring to FIG. 2, the first electrode pad 130a may include a lower layer 131 and an upper layer 132. In one embodiment, the lower layer 131 is made of the same material as the auxiliary wiring pattern 120. In one embodiment, the upper layer 132 is made of the same material as the first electrode 130. The lower layer 131 may be formed simultaneously with the auxiliary wiring pattern 120 and be directly connected to (i.e., physically contacting) the auxiliary wiring pattern 120. The upper layer 132 may be formed simultaneously with the first electrode 130. When the lower layer 131 is directly connected to the auxiliary wiring pattern 120, the upper layer 132 may not be directly connected to the first electrode 130.

Referring to FIG. 3, the second electrode pad 160a may include a lower layer 161 and an upper layer 162. In one embodiment, the lower layer 161 is made of the same material as the auxiliary wiring pattern 120. In one embodiment, the upper layer 162 is made of the same material as the second electrode 160. The lower layer 161 may be formed simultaneously with the auxiliary wiring pattern 120, and the upper layer 162 may be formed simultaneously with the second electrode 160.

Hereinafter, a method of manufacturing an OLED for a lighting device according to embodiments of the present disclosure will be described with reference to FIGS. 6A to 6K.

First, the auxiliary wiring pattern 120 may be disposed on the substrate 110 divided into the LA, and the PA formed outside the LA, as shown in FIG. 6A.

The auxiliary wiring pattern 120 may include a plurality of auxiliary wirings electrically connected to each other. The auxiliary wiring pattern 120 may be formed of a metal material, and may have a taper-shaped cross-section whose width is gradually narrower toward an upper portion thereof through, for example, the deposition and dry etching.

Further, the auxiliary wiring pattern 120 may be formed in both the LA and the PA. With respect to the PA, it is possible to form a lower layer (131 of FIG. 2) of the first electrode pattern and a lower layer (161 of FIG. 3) of the second electrode pattern which are having the same material as the auxiliary wiring pattern at this stage.

Next, as shown in FIG. 6B, the first electrode 130 may be disposed on the substrate and the auxiliary wiring pattern 120. The first electrode 130 may be formed of a transparent conductive oxide (TCO) material, such as ITO. The first electrode 130 may be formed in the entire LA, and in a part of the PA to form the first electrode pad 130a. That is, the upper layer 132 of the first electrode pad 130a having the same material as the first electrode may be formed in the first electrode disposition step.

Figure 6D:
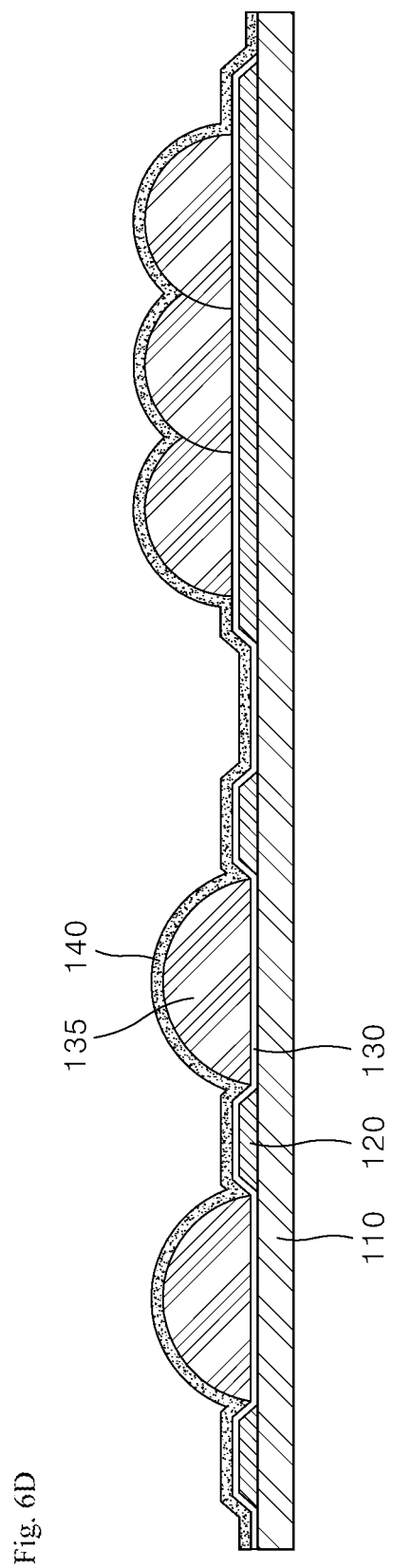

Next, the passivation layer 140 may be formed as shown in FIGS. 6C to 6E.

First, as shown in FIG. 6C, a polymer 135 may be disposed on the first electrode 130, and may be placed between the adjacent auxiliary wirings of the auxiliary wiring pattern in the LA. As will be discussed in further detail below, the polymer 135 is used as a masking layer.

The disposition of the polymer 135 may be performed by printing a liquid polymer by an ink jet method and then curing the liquid polymer. The liquid polymer refers to a state in which a polymer is dissolved in a solvent or a polymer in a liquid state at a corresponding process temperature. The liquid polymer may be polyvinyl alcohol (PVA), poly-methyl methacrylate (PMMA), etc., which may be cured at a low temperature, but is not limited thereto.

The auxiliary electrode 120 may act as a stepped portion, and the inkjet-printed polymer may be self-aligned between the adjacent auxiliary wirings of the auxiliary wiring pattern by such a stepped portion. The inkjet-printed polymer may have a hemispherical shape by surface tension, as shown in FIG. 6C.

Also, the polymer 135 may be disposed on the first electrode pad in the PA in order to form a passivation layer at the edge of the PA. Namely, as shown in FIG. 6C, the polymer 135 may be formed on the first electrode pad 130a, which includes the lower layer 131 and the upper layer 132 of the first electrode pad.

In addition, the passivation layer 140 is disposed at the edges of the LA and the PA, which are vulnerable to moisture or air permeation. To this end, the polymer 135 may not be disposed at the edges of the LA and the PA.

Subsequent to the polymer 135 being formed, as shown in FIG. 6D, passivation material may be deposited on the first electrode 130 using the polymer 135 as a mask.

The passivation material may be an organic material, such as polyimide, etc.; or an inorganic material, such as alumina, silicon nitride, etc. The deposition of the passivation material may be performed by an atomic layer deposition (ALD) method, a chemical vapor deposition (CVD) method, etc., and more preferably, by an atmospheric pressure ALD method. The atmospheric pressure ALD method, which is a deposition method in which a thin film is formed on an atomic basis at a normal pressure, is based on surface reaction and desorption of a byproduct. $Al_2O_3$ may be deposited by the ALD deposition method, mainly using a trimethyl-aluminum (TMA) as a precursor. In addition, $Al_2O_3$, $ZrO_2$, $HfO_2$, $TiO_2$, etc., also may be deposited by the atmospheric pressure ALD method, using $Zr(NMe_2)_4$, $HfCl_4$, or $TiCl_4$ as a precursor.

Figure 6F:
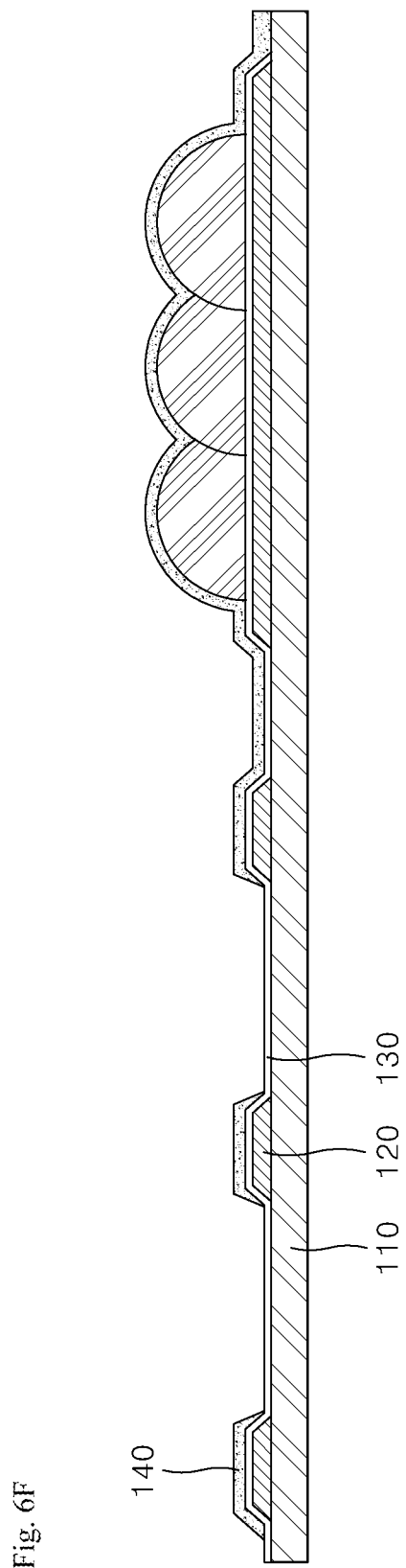

Thereafter, as shown in FIG. 6E, the polymer 135 and portions of the passivation material may be removed to form a passivation layer on respective upper portions of the auxiliary wirings of the auxiliary wiring patterns in the LA. The resulting passivation layer on the respective upper portions of the auxiliary wirings of the auxiliary wiring patterns form the passivation layer 140. As previously discussed with respect to FIG. 5, the portions of the passivation layer 140 on the auxiliary wiring pattern 120 each have a cross-sectional shape corresponding to that of the auxiliary wiring pattern 120. Also, as shown in FIG. 6E, the polymer formed in the PA (e.g., the polymer on the first electrode pad 130a) may be removed at this stage. As another example, the polymer formed in the PA may be reserved as shown in FIG. 6F, and may be removed in a subsequent process (for example, a pad opening step of FIG. 6J).

In one embodiment, the polymer includes a photolyzable catalyst, and the removal of the polymer may be performed by photolyzing the catalyst by means of light irradiation. Here, $TiO_2$, ZnO, CDS, $ZrO_2$, $SnO_2$, $V_2O_2$, $WO_3$, Cerium stearate, $SrTiO_3$, etc., may be used as the photolyzable catalyst. The light used to remove the polymer may be laser light or intense pulsed light (IPL) which periodically irradiates light in a pulse form. When the IPL type light is used, the photolyzable catalyst is activated in a state in which the temperature of the substrate is kept constant, and thereby the adhesion of the polymer may be weakened.

Figure 6G:
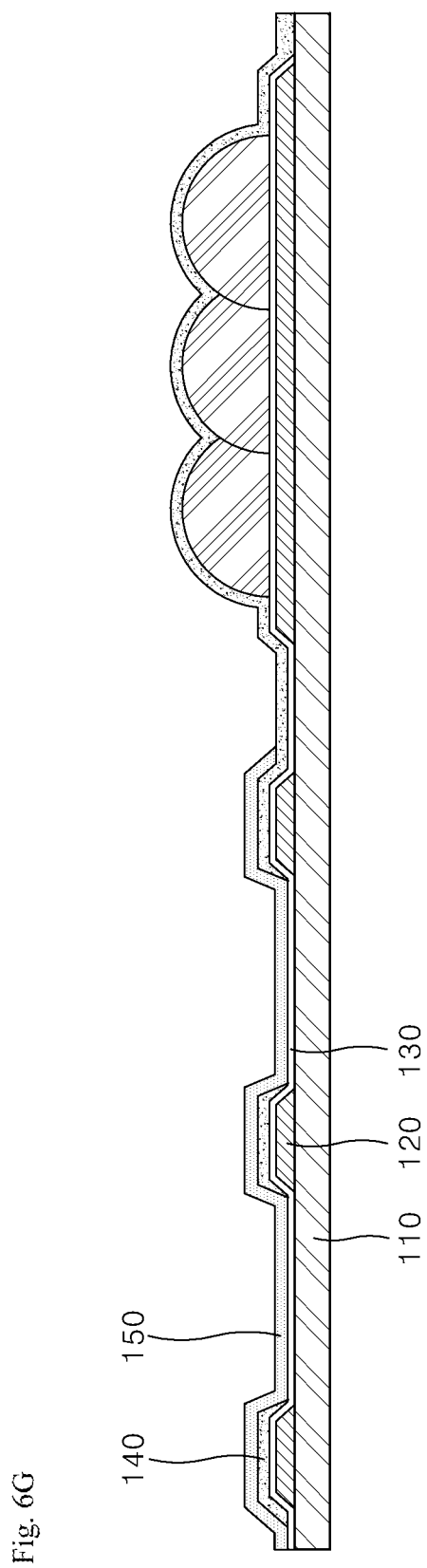

Next, as shown in FIG. 6G, the OLED light emitting structure 150 may be disposed in the LA. Each layer of the OLED light-emitting structure 150 may be formed by depositing an organic material, such as copper phthalocyanine (CuPc), N,N-Di(naphthalen-1-yl)-N,N'-diphenylbenzidine: NPB) and tris-8-hydroxyquinoline aluminum (Alq3) through, for example, a vacuum deposition method.

Next, as shown in FIG. 6H, the second electrode 160 may be disposed on the OLED light emitting structure 150. The second electrode 160 may be formed of a metal material or a TCO material.

The second electrode 160 may be formed in the entire LA and may be formed in a part of the PA to form a second electrode pad 160a, as shown in FIG. 3. In the second electrode disposition step, the upper layer 162 of the second electrode pad 160a having the same material as the second electrode may be formed.

After the second electrode 160 is formed, an aging voltage may be applied to an organic layer of the OLED light emitting structure 150 to further perform a process of aging the OLED light emitting structure 150. An organic light emitting material may have a short lifespan and be vulnerable to moisture or oxygen. For this reason, the device formed of the organic light emitting material may be damaged when a high voltage or a high current is applied thereto. Further, since an interfacial property between the first and second electrodes 130 and 160 and the OLED light emitting structure 150 are poor, the device may have unstable properties. Furthermore, when the second electrode 160 is formed, impurities may be laminated in the OLED light emitting structure 150 to lower the light emission property and color of the organic material.

In order to solve these problems, it is possible to age the OLED light emitting structure 150 in a short time by applying a high aging voltage to the OLED light emitting structure 150. Here, the aging voltage may be higher than the voltage applied to the first electrode 130 and the second electrode 160, and may be the reverse voltage of the voltage applied to the first electrode 130 and the second electrode 160.

Next, as shown in FIG. 6I, the encapsulating layer 170 may be formed on the second electrode 160.

Figure 6J:
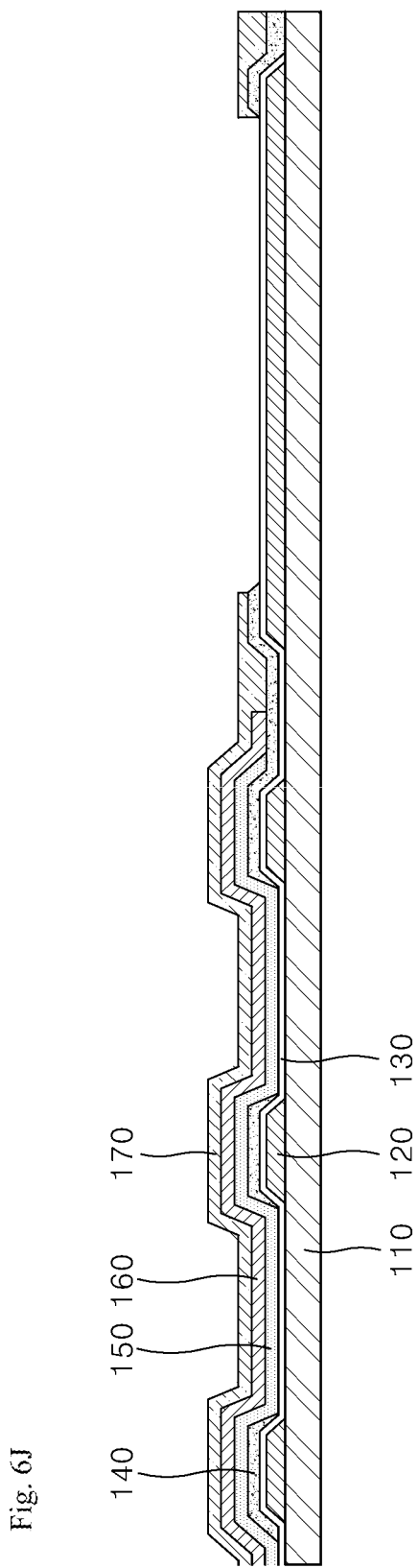

Also, when the polymer 135 remains on the first electrode 130a, a process of removing the polymer 135 may be performed to open a pad, as shown in FIG. 6J.

Also, it is possible to further perform a process of disposing a flattened adhesive layer 180 and attaching a protective film 190 thereon, as shown in FIG. 6K. The protective film 190 may serve to prevent moisture and air from permeating from the outside. Here, a PET substrate, a metal foil, etc., may be used as the protective film 190.

Through the above-described processes, the OLED panel for a lighting device may be manufactured. A publicly known process may be further included in addition to the processes.

The present disclosure is described with reference to embodiments described herein and accompanying drawings, but is not limited thereto. It should be apparent to those skilled in the art that various changes or modifications which are not exemplified herein but are still within the spirit and scope of the present disclosure may be made. The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An organic light emitting diode (OLED) panel for a lighting device, comprising:
    a substrate including a light emitting area, and a pad area formed outside of the light emitting area;
    an auxiliary wiring pattern disposed on the substrate, the auxiliary wiring pattern having a taper-shaped cross-section whose width is gradually narrower toward an upper portion thereof;
    a first electrode disposed on the substrate on which the auxiliary wiring pattern is disposed;
    a passivation layer disposed on the first electrode within an area where the auxiliary wiring pattern disposed;
    an OLED light emitting structure disposed on the first electrode on which the passivation layer is disposed;
    a second electrode disposed on the OLED light emitting structure; and
    an encapsulating layer disposed on the second electrode,
    wherein a cross-section of the passivation layer has a shape that corresponds to a shape of upper surfaces of the auxiliary wiring pattern in the light emitting area.

2. The OLED panel for a lighting device of claim 1, wherein the upper surfaces of the auxiliary wiring pattern includes top and side surfaces that are uppermost.

3. The OLED panel for a lighting device of claim 1, wherein
    the passivation layer includes an upper planar portion, and an inclined portion extending downward from the upper planar portion.

4. The OLED panel for a lighting device of claim 3, wherein
    the auxiliary wiring pattern includes a planar portion and an inclined portion, and
    the upper planar portion and the inclined portion of the passivation layer overlaps the planar portion and the inclined portion, respectively, of the auxiliary wiring pattern.

5. The OLED panel for a lighting device of claim 1, wherein
    the passivation layer is further disposed at an edge of the light emitting area and an edge of the pad area.

6. The OLED panel for a lighting device of claim 1, wherein
    the first electrode is formed of a transparent conductive oxide (TCO) material, and
    the auxiliary wiring pattern is formed of a metal material.

7. The OLED panel for a lighting device of claim 1, wherein
    the OLED light emitting structure and the second electrode each have a cross-section corresponding to a cross-section of the first electrode.

8. The OLED panel for a lighting device of claim 1, further comprising:
    a first electrode pad electrically coupled to the first electrode; and
    a second electrode pad electrically coupled to the second electrode, wherein
    the first electrode pad and the second electrode pad are disposed in the pad area,
    the first electrode pad includes a lower layer having the same material as the auxiliary wiring pattern, and an upper layer having the same material as the first electrode, and
    the second electrode pad includes a lower layer having the same material as the auxiliary wiring pattern, and an upper layer having the same material as the second electrode.

9. A method of manufacturing an organic light emitting diode (OLED) panel for a lighting device, comprising:
    forming an auxiliary wiring pattern on a substrate, the auxiliary wiring pattern including a plurality of auxiliary wirings electrically coupled to each other, the substrate including a light emitting area and a pad area;

forming a first electrode on the substrate on which the auxiliary wiring pattern is disposed;

forming a polymer on the first electrode and between adjacent auxiliary wirings of the plurality of auxiliary wirings in the light emitting area;

forming a passivation material on the first electrode and the polymer;

removing the polymer and portions of the passivation material to form a passivation layer on respective upper portions of the plurality of auxiliary wirings in the light emitting area;

forming an OLED light emitting structure on the first electrode on which the passivation layer is disposed;

forming a second electrode on the OLED light emitting structure; and forming an encapsulating layer on the second electrode.

10. The method of claim 9, wherein
the forming of the polymer is performed by printing a liquid polymer by an ink jet method and then curing the liquid polymer.

11. The method of claim 9, wherein
the forming of the passivation material is performed by an atmospheric pressure atomic layer deposition (ALD) method.

12. The method of claim 9, wherein
the polymer is not disposed at an edge of the light emitting area and an edge of the pad area such that the passivation layer is further disposed at the edge of the light emitting area and the edge of the pad area.

13. The method of claim 9, wherein
the polymer includes a photolyzable catalyst, and
the removing of the polymer is performed by photolyzing the catalyst by means of light radiation.

14. The method of claim 9, wherein
a first electrode pad is electrically coupled to the first electrode,
a second electrode pad is electrically coupled to the second electrode,
the first electrode pad and the second electrode pad are disposed in the pad area,
the first electrode pad is disposed in such a manner that a lower layer thereof having the same material as the auxiliary wiring pattern is formed in the auxiliary wiring pattern forming step and an upper layer thereof having the same material as the first electrode is formed in the first electrode forming step, and
the second electrode pad is disposed in such a manner that a lower layer thereof having the same material as the auxiliary wiring pattern is formed in the auxiliary wiring pattern forming step and an upper layer thereof having the same material as the second electrode is formed in the second electrode forming step.

15. The method of claim 14, further comprising:
forming a polymer on the upper layer of the first electrode pad; and
removing the polymer on the upper layer of the first electrode pad to expose the upper layer of the first electrode pad in the passivation forming step.

16. The method of claim 14, further comprising:
forming a polymer on the upper layer of the first electrode pad; and
removing the polymer disposed on the upper layer of the first electrode pad to expose the upper layer of the first electrode pad after the encapsulating layer is formed.

17. A device, comprising:
a substrate;
a wiring layer on the substrate, the wiring layer including a first wiring portion having an angled sidewall and an upper surface;
a first electrode on the substrate and the wiring layer;
a passivation layer on the first electrode, the passivation layer including a first passivation portion having an angled sidewall and an upper surface, the angled sidewall and the upper surface of the first passivation portion overlapping the angled sidewall and the upper surface, respectively, of the first wiring portion;
an organic light emitting diode (OLED) light emitting structure on the first electrode and the passivation layer; and
a second electrode on the OLED light emitting structure.

18. The device of claim 17, further comprising:
an encapsulating layer on the second electrode.

19. The device of claim 18, further comprising:
an adhesive layer on the encapsulating layer; and
a protective film on the adhesive layer.

20. The device of claim 17 wherein the wiring layer includes a second wiring portion that is spaced from the first wiring portion by the first electrode, and the second wiring portion has an angled sidewall and an upper surface.

21. The device of claim 20 wherein the passivation layer includes a second passivation portion that is spaced from the first passivation portion by OLED light emitting structure, the second passivation portion has an angled sidewall and an upper surface, and the angled sidewall and the upper surface of the second passivation portion overlaps the angled sidewall and the upper surface, respectively, of the second wiring portion.

22. The device of claim 17 wherein the first wiring portion includes a lower surface having a larger surface area than the upper surface of the first wiring portion.

* * * * *